United States Patent [19]

Tashiro et al.

[11] Patent Number: 4,564,774
[45] Date of Patent: Jan. 14, 1986

[54] BINARY LOGIC DEVICE HAVING INPUT AND OUTPUT ALTERNATING SIGNALS

[75] Inventors: Korefumi Tashiro, Hitachi; Hiroyuki Akiyama, Katsuta, both of Japan

[73] Assignee: Hitachi, Ltd., Tokyo, Japan

[21] Appl. No.: 520,687

[22] Filed: Aug. 5, 1983

[30] Foreign Application Priority Data

Aug. 9, 1982 [JP] Japan ................................ 57-137312

[51] Int. Cl.$^4$ ........................................ H03K 19/003
[52] U.S. Cl. ................................... 307/479; 307/442;
307/443; 307/219.1; 307/526; 371/25
[58] Field of Search ............... 307/442, 443, 445, 479,
307/480, 219.1, 510, 271, 522–529, 464;
340/870.12, 870.13, 870.26, 825.64, 825.73,
825.74; 371/25

[56] References Cited

U.S. PATENT DOCUMENTS

| | | | |
|---|---|---|---|
| 3,026,482 | 3/1962 | Filipowsky | 307/479 X |
| 3,044,017 | 7/1962 | Lewis | 307/479 |
| 3,077,564 | 2/1963 | Forrer | 307/479 |
| 3,183,445 | 5/1965 | Sigel | 307/479 X |
| 3,192,484 | 6/1965 | Carroll | 307/479 X |
| 3,654,485 | 4/1972 | Lotz | 307/479 |
| 4,017,801 | 4/1977 | Riedel | 307/479 X |

Primary Examiner—Stanley D. Miller
Assistant Examiner—D. R. Hudspeth
Attorney, Agent, or Firm—Antonelli, Terry & Wands

[57] ABSTRACT

There is provided a logic device wherein an alternating input signal having a frequency which is one of two frequencies allotted to two input logical values, respectively, positive logic "1" and negative logic "0", is inputted to the device. An output logical value is decided depending on the determination which frequencies the input frequency coincides with or not, and an alternating output signal having a frequency which corresponds to the output logical value is delivered out of the device. The logic device, even when constituted with semiconductor elements, can have highly reliable failsafe capability and can be reduced in size and weight.

17 Claims, 12 Drawing Figures

BINARY LOGIC DEVICE HAVING INPUT AND OUTPUT ALTERNATING SIGNALS

This invention relates to an improvement in logic devices and more particularly to a logic device which has a fail-safe capability.

For example, an automatic train control (ATC) system for railway vehicles must have a highly reliable fail-safe capability since it intends to protect human life and prevent fatal damage by preventing a train collision. Therefore, a circuit for effecting logical decision included in the ATC system is designed to be a multisystem in which outputs of respective systems are collectively applied to a fail-safe coincidence circuit or a fail-safe majority circuit which decides a final output. Thus, individual logic circuits are designed to have a fail-safe capability and they are arranged to provide the multisystem directed to perfect attainment of the intended purpose.

The majority circuit is however singular in terms of multiplexing and its fail-safe capability has a great effect on fail-safe capability of the entire system.

Accordingly, efforts have been made to obtain a majority logic circuit of highly reliable fail-safe capability. At present, however, electromagnetic relays are exclusively used for the majority logic circuit and difficulties are encountered in reducing the size and weight of the device and power consumption.

Incidentally, a fail-safe capability can be obtained with the use of electromagnetic relays for the following reasons.

Failure of the electromagnetic relay will occur under a make-contact or break-contact condition and generally speaking, the possibility of generation of a make-contact failure is 1/1000 or less than that of the break-contact failure.

This is because while only fusion of a contact is prone to cause a make-contact failure, a great number of causes can be attributed to break-contact failure, including a faulty contact due to contamination and oxidization of the contact, disconnection and internal short-circuit of the drive coil, failure of the drive power supply, bending of the movable contact and the like causes.

If the amount of current passing through the contact is suppressed to below a lower limit responsible for fusion to thereby prevent fusion of the contact, it will be considered that only break-contact failures may be involved in a potential failure of the relay.

For this reason, by arranging an electromagnetic relay such that its output produced in a make-contact operation is connected to control a circuit which is expected to undergo dangerous accident and its output produced in a break-contact operation is connected to control a safe circuit which is not expected to undergo dangerous accident, the electromagnetic relay can be used as a fail-safe logic element.

In semiconductor elements, failure occurs at substantially the same probability under conduction and non-conduction conditions.

This is because conduction and non-conduction failures in semiconductor elements result from the same causes such as degradation due to diffusion of impurity or overheat, disconnection or contact of lead conductors, and short-circuit or fusion due to excessive current and voltage.

For this reason, it is impossible to arrange a semiconductor element such that its output logical values are distinctly used for controlling imminent and safe circuits, and it has been considered that extreme difficulties are encountered in obtaining a fail-safe capability in a desired circuit generally termed a random logic which is constituted by combining basic semiconductor logic elements.

An object of this invention is therefore to provide a logic device based on semiconductor elements which is capable of being reduced in size and weight and which can have a highly reliable fail-safe capability.

According to the present invention, there is provided a logic device comprising means for inputting to the device an alternating input signal having a frequency which is one of two frequencies allotted to two input logical values, respectively, namely "1" and "0", means for deciding an output logical value depending on whether or not the input signal frequency coincides with predetermined frequencies, and means for delivering out of the device an alternating output signal having a frequency which corresponds to the output logical value.

By making the frequency of the alternating signal correspond to the logic value, of probability generation of an unfavorable dangerous or abnormal output in the event of failure of the system can be minimized. In addition, because of the decision by means of the logic element normally operable even if the input of the device is abnormal, the safe output can be generated steadily. Consequently, even through the use of the semiconductor element which is liable to become faulty, a highly reliable fail-safe element can be realized to provide a fail-safe logic device which can be reduced in size and weight.

In a logic circuit requiring two or more inputs, a predetermined arithmetic operation, for example, addition is effected for logical values corresponding to frequencies of the two or more input alternating signals prior to the decision of the frequency band. This arithmetic operation ensures that not only commonly used logic devices such as AND, OR, NAND, NOR and EX-OR devices can be constructed but also a logic circuit consisting of these devices in combination, for example, a majority logic circuit can be constructed.

The invention will now be described by way of example.

Figure 1:
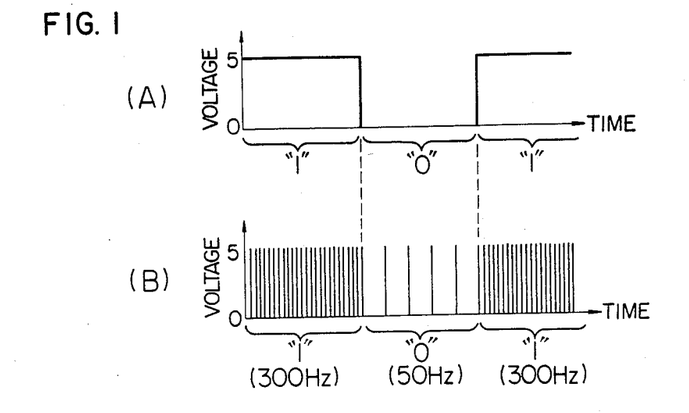
FIG. 1 shows an example of a logic signal according to the present invention.

Referring to FIG. 1, correspondence can be made between a conventional logic signal (A) and a logic signal (B) according to the present invention. These logic signals correspond to both binary "1" and "0".

A waveform as shown in FIG. 1(A) indicates a conventional binary logic in the form of a voltage signal wherein, for example, 5 V voltage represents "1" and 0 V voltage represents "0".

On the other hand, in a waveform as shown in FIG. 1(B) indicating a logic signal according to the invention, an alternating signal of 300 Hz represents "1" and an alternating signal of 50 Hz represents "0". Thus, according to the present invention, different logical values are represented by different frequencies and frequency bands are graded as exemplified in FIGS. 2 to 4.

Figure 2:
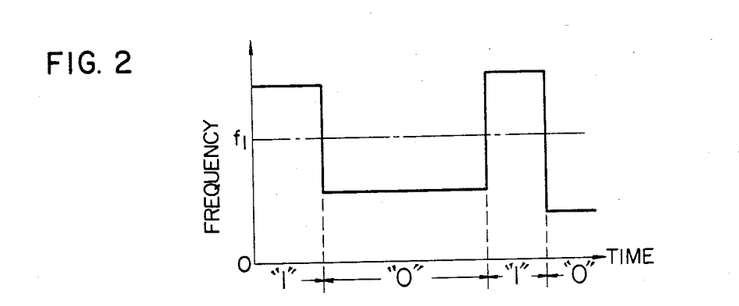
FIGS. 2 to 4 are graphic representations showing different examples of decision of frequency band according to the present invention.

FIG. 2 shows the simplest grading of frequency bands wherein a band above a given frequency $f_1$ is defined to represent positive logic and a band below the frequency $f_1$ represents negative logic.

Figure 3:
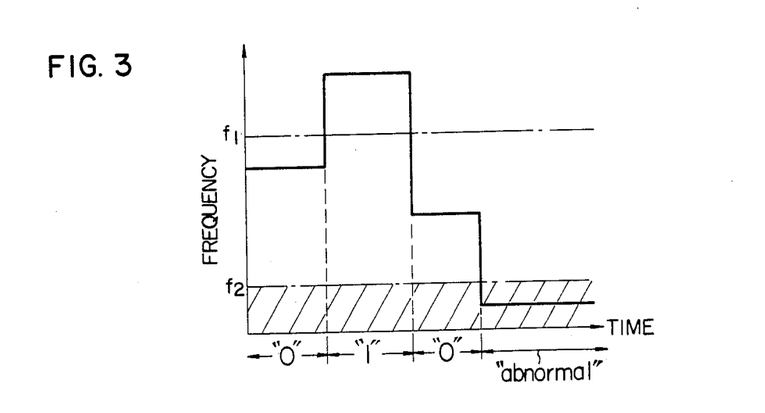

FIG. 3 shows a tertiary logic containing, in addition to positive and negative logic bands, a band representative of abnormal conditions. In FIG. 3, a band above a given frequency $f_1$ is defined to represent positive logic, a band between frequencies $f_1$ and $f_2$ represents negative logic, and a band below the given frequency $f_2$ represents abnormal conditions.

Figure 4:
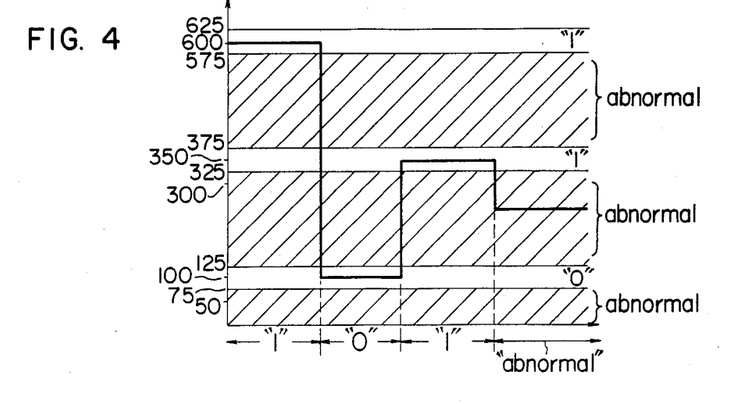

In FIG. 4, positive and negative logics under normal operation are respectively confined within three different frequency bands which are spaced from each other and the other bands are defined to represent abnormal conditions. More particularly, a band centered at 600 Hz and ranging from 575 to 625 Hz and a band centered at 350 Hz and ranging from 325 to 375 Hz are defined to represent positive logic, a band centered at 100 Hz and ranging from 75 to 125 Hz is defined to represent negative logic and the other bands are defined to represent abnormal conditions.

Figure 5:
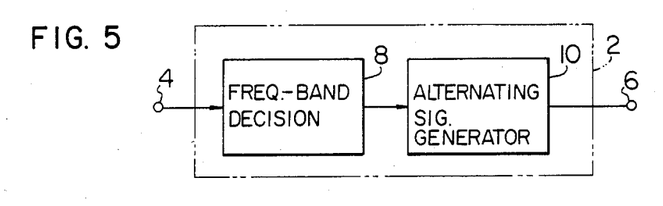
FIG. 5 is a block diagram showing one embodiment of a logic device according to the invention.

FIG. 5 shows, in block form, one embodiment of a logic device according to the present invention.

The logic device 2 comprises an input terminal 4, an output terminal 6, a frequency band decision section 8 and an alternating signal generator 10. The section 8 and generator 10 are formed internally of the device 2. When an alternating input signal is applied to the terminal 4, the decision section 8 decides the frequency band of the alternating input signal to transmit an output logical value to be delivered out of the section 8 to the alternating signal generator 10. The generator 10 generates an alternating output signal of a frequency corresponding to the given output logical value. The alternating output signal is delivered to the terminal 6.

It is now assumed that the logic device is a NOT device and that frequency bands $f_P$, $f_N$ and $f_E$ other than $f_P$ and $f_N$ of the alternating input and output signals are defined to represent positive logic, negative logic and abnormal conditions, respectively, the logic device 2 operates as shown in Table 1.

TABLE 1

| Band decision | Output signal |
|---|---|
| $f_P$ ("1") | $f_N$ ("0") |
| $f_N$ ("0") | $f_P$ ("1") |
| $f_E$ (abnormal) | $f_E$ (abnormal) |

In Table 1, logical values or truth values are parenthesized.

The logic device 2 thus functions to operate as a NOT (inversion) device by delivering out alternating signals of the frequencies shown in Table 1 corresponding to three different decision results by the band decision section 8.

This construction has very low probability of erroneously deciding that the frequency of the alternating input signal corresponds to a frequency representative of an erroneous logical value, and can readily narrow the frequency band for deciding a band of generation of the dangerous output to thereby improve fail-safe capability. In addition, even in the event of failure of the alternating signal generator, the probability of erroneously generating an alternating signal of a frequency within a specified narrow band corresponding to a logical value representative of the dangerous or abnormal output is very low so that a logic device of highly reliable fail-safe capability can be obtained.

Obviously, it is not always necessary to allot the same frequency to the input and output logical values. The allotment to the input and output logical values may be established in inverse relationship or alternatively, different frequencies may be allotted to the input and output logical values. The fail-safe capability may also be ensured by not delivering the frequency $f_E$ representative of the dangerous or abnormal output but delivering either the frequency $f_N$ of $f_P$ representative of the safe output when the frequency band decision section 8 decides that an alternating input signal is applied which has a frequency falling within the frequency band $f_E$ representative of abnormal conditions.

Figure 6:
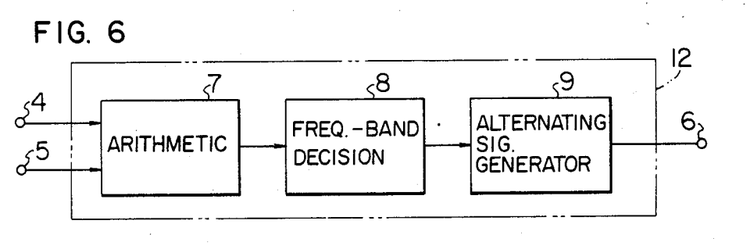
FIG. 6 is a block diagram showing another embodiment of the logic device according to the invention.

FIG. 6 shows, in block form, another embodiment of the logic device according to the invention.

In comparison with FIG. 5, a logic device 12 additionally has an input terminal 5 and an arithmetic operation section 7. This logic device 12 can constitute, apart from the NOT device, a two-input type logic device such as an OR, AND, EX-OR, NOR or NAND device.

The arithmetic operation section 7 performs a predetermined arithmetic operation for frequencies of two alternating input signals applied to the input terminals 4 and 5. This arithmetic operation may be of either addition or subtraction but most preferably, addition may be involved to ensure the logic device 12 to operate as shown in Table 2.

TABLE 2

| No. | Input signals 4 | Input signals 5 | Frequency band decision | Output signal/(operation of arithmetic operation Section 7) NOT | OR | AND | EX-OR | NOR | NAND |
|---|---|---|---|---|---|---|---|---|---|
| 1 | $f_P$ | $f_P$ | $2f_P$ | $f_N$ | $f_P$ | $f_P$ | $f_N$ | $f_N$ | $f_N$ |
| 2 | $f_P$ | $f_N$ | $f_P + f_N$ | — | $f_P$ | $f_N$ | $f_P$ | $f_N$ | $f_P$ |
| 3 | $f_N$ | $f_P$ | $f_P + f_N$ | — | $f_P$ | $f_N$ | $f_P$ | $f_N$ | $f_P$ |
| 4 | $f_N$ | $f_N$ | $2f_N$ | $f_P$ | $f_N$ | $f_N$ | $f_N$ | $f_P$ | $f_P$ |
| 5 | $f_P$ | $f_E$ | $f_P + f_E$ | — | $f_E$ | $f_E$ | $f_E$ | $f_E$ | $f_E$ |
| 6 | $f_E$ | $f_P$ | $f_P + f_E$ | — | $f_E$ | $f_E$ | $f_E$ | $f_E$ | $f_E$ |
| 7 | $f_N$ | $f_E$ | $f_N + f_E$ | — | $f_E$ | $f_E$ | $f_E$ | $f_E$ | $f_E$ |
| 8 | $f_E$ | $f_N$ | $f_N \pm f_E$ | — | $f_E$ | $f_E$ | $f_E$ | $f_E$ | $f_E$ |

TABLE 2-continued

| | Input signals | | Frequency band | Output signal/(operation of arithmetic operation Section 7) | | | | | |
|---|---|---|---|---|---|---|---|---|---|
| No. | 4 | 5 | decision | NOT | OR | AND | EX-OR | NOR | NAND |
| 9 | $f_E$ | $f_E$ | $2f_E$ | $f_E$ | $f_E$ | $f_E$ | $f_E$ | $f_E$ | $f_E$ |

To constitute a NOT device, the logic device 12 may be replaced by the device of FIG. 5 without arithmetic operation section 7 and one of the two input terminals 4 and 5 may be excluded to permit the logic device 12 to operate pursuant to Table 1. But as far as Table 2 is concerned, a NOT device is constituted by interconnecting the input terminals 4 and 5. In this case, input signals both in the form of either the frequency $f_P$, $f_N$ or $f_E$ are employed so that only three results of arithmetic operation, that is, addition represented by $2f_P$, $2f_N$ and $2f_E$ are involved. Accordingly, when the frequency band decision provides $2f_P$, $2f_N$ or $2f_E$, an alternating signal of frequency $f_N$, $f_P$ or $f_E$ is delivered out correspondingly.

Next, the logic device 12 taken for an OR device will be described. Assuming that the alternating signal frequency $f_P$ corresponding to input positive logic is 300 Hz and the alternating signal frequency $f_N$ corresponding to input negative logic is 50 Hz, the band decision section 8 included in the logic device for performing OR operation in Table 2 will operate pursuant to a logic signal scheme as shown in FIG. 4. More particularly, in item No. 1 in Table 2, a result of addition $f_a (=2f_P=600$ Hz) is obtained so that pursuant to FIG. 4, this result is judged as a frequency corresponding to input positive logic "1" and an output frequency $f_P$ of 300 Hz corresponding output positive logic is delivered out. In items No. 2 and No. 3 in Table 2, a result of addition $f_a$ is $f_P+f_N$ which is 350 Hz so that the input positive logic is also decided pursuant to FIG. 4 and an output frequency $f_P$ of 300 Hz corresponding to output positive logic is delivered out. In item No. 4, $f_a=2f_N=100$ Hz stands so that the input negative logic i.e., "0" is decided and an alternating output signal frequency $f_N$ of 50 Hz corresponding to output negative logic is delivered out. In the ensuring items No. 5 to No. 9, an abnormal input frequency $f_E$ is involved, indicating a frequency band other than the three bands described above, so that an output frequency $f_E$ (for example, zero Hz) representative of "abnormal" is delivered out.

Similarly, in accordance with the generation of output signals as shown in Table 2 corresponding to results of the frequency band decision, an AND, EX-OR, NOR or NAND device can be obtained.

Figure 7:
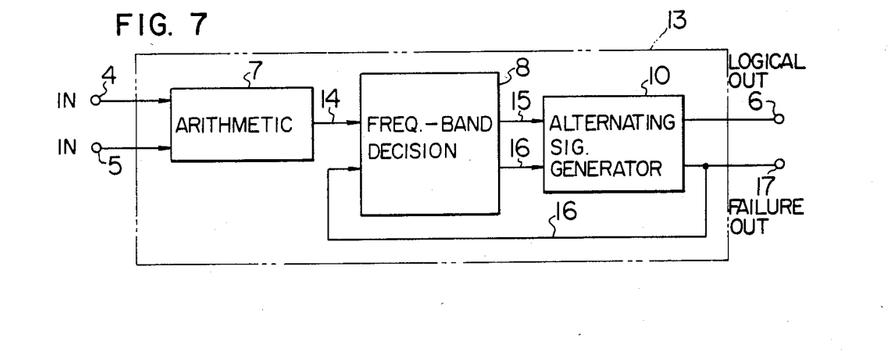
FIG. 7 is a block diagram showing still another embodiment of the logic device according to the invention.

FIG. 7 shows, in block form, still another embodiment of the logic device according to the invention which can further improve fail-safe capability.

A logic device 13 comprises two input terminals 4 and 5, an arithmetic operation section 7 adapted to perform addition of frequencies of two alternating input signals applied to the two input terminals 4 and 5, a band decision section 8 connected to receive a result 14 of arithmetic operation for frequency band decision, an alternating signal generator 10 for generating a frequency corresponding to an output logical value of a decision signal 15, and an output terminal 6 for delivery of an output signal from the signal generator 10. A failure detection feedback signal 16, which is cyclically feed back from the alternating signal generator 10 through the band decision section 8, is delivered to an output terminal 17.

This logic device 13 performs the same logic operation as the FIG. 6 logic device and in addition, when both the band decision section 8 and alternating signal generator 10 are operating normally, the failure detection feedback signal 16 assumes an alternating signal of a predetermined frequency to indicate that the normal operation of the logic device 13 is evidenced by the appearance of the signal 16 on the output terminal 17.

Figure 8:
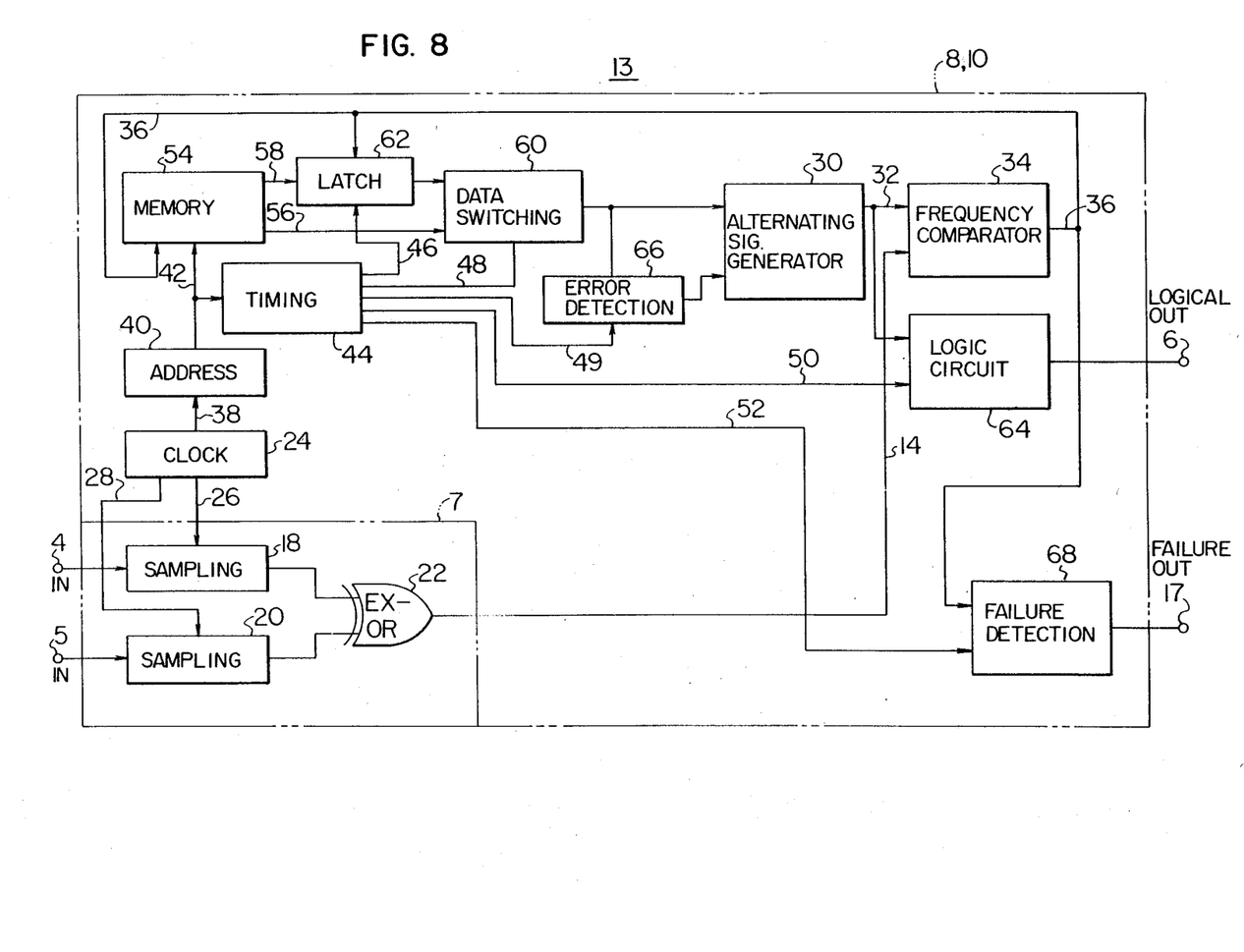
FIG. 8 is a block diagram showing implementation of the FIG. 7 embodiment.

The FIG. 7 embodiment can be implemented as shown, in block form, in FIG. 8. In this implementation, an operation scheme termed a ring operation is employed which is a modified digital differential analyzer (DDA) operation. This ring operation scheme has been used widely in the field of automatic train control and is known. Details thereof are described in Japanese Pat. Nos. 923,327, 964,816 and 1,072,745.

In the logic device 13 comprised of the arithmetic operation section 7, band decision section 8 and alternating signal generator 10, the band decision section 8 and alternating signal generator 10 share the same operation route on a time division basis. It will be appreciated that in the FIG. 8 implementation, the arithmetic operation section is used in common for operations on a time division basis and therefore the decision signal 15 and signal 16 in FIG. 7 can not be designated distinctly.

Turning to FIG. 8, the arithmetic operation section 7 has sampling circuits 18 and 20 and an exclusive OR (EX-OR) gate 22 and performs addition of frequencies of alternating input signals applied to the input terminals 4 and 5. The sampling circuits 18 and 20 respectively receive clock signals 26 and 28, which are out of phase with respect to each other, from a clock generator 24 so as to steadily displace rise and fall of one of two alternating input signals from that of the other. The two out-of-phase signals are applied to the EX-OR gate 22. As a result, the EX-OR gate 22, even when two alternating input signals of the same frequency are applied to the input terminals 4 and 5, steadily adds the frequencies of the two alternating input signals and produces an alternating signal 14 of a summed frequency.

Basically, the frequency band decision section 8 comprises a frequency comparator 34. At the comparator 34, the alternating signal 14 of summed frequency is compared with an alternating signal 32 of a reference frequency produced from an alternating signal generating circuit 30 to thereby effect band decision. In order to decide a plurality of frequency bands as exemplified in FIG. 4, the alternating signal generator 30 alternately generates the plurality of alternating signals 32 of different reference frequencies on a time division basis, and the frequency comparator 34 also compares the alternating signal 14 with the plurality of alternating reference signals 32 on the time division basis. Accordingly, the frequency band is decided depending on the time at which a compared decision signal 36 from the frequency comparator 34 changes.

The alternating signal generator 10 comprises the alternating signal generating circuit 30 which generates alternating signals of frequencies corresponding to output logical values in accordance with results of the band decision on a time division basis which is different from that for the band decision.

The operation will now be described in greater detail.

A clock signal 38 produced from the clock generator 24 is converted into a serial address signal 42 by an address circuit 40. The logic device is responsive to the serial address signal 42 to repeat ring operations at high speeds in a unit of one address period.

The address signal 42 is applied to a timing circuit 44 which in turn generates a plurality of timing signals 46, 48, 49, 50 and 52 necessary for operations on a time division basis.

Figure 9:
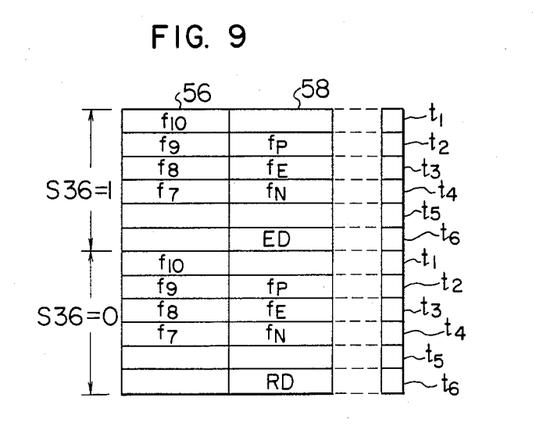
FIG. 9 shows an organization of data stored in a memory in FIG. 8.

When a memory 54 for storage of data as shown in FIG. 9 responds to the address signal 42 and the decision signal 36, two data series 56 and 58 are read out of the memory 54. The data series 56 represents a plurality of reference frequencies $f_{10}$ to $f_7$, and the data is read out on a time division basis, at time slots $t_1$ to $t_6$ to be described later, and applied to the alternating signal generating circuit 30 through a data switching circuit 60. In this manner, the alternating signal generating circuit 30 produces the plurality of different reference frequencies $f_{10}$ to $f_7$ on a time division basis, thus providing reference values for the frequency comparison.

Results of comparison lead to changes of the decision signal 36 at particular timings as mentioned previously. Thus, at the timing of occurrence of the decision signal 36, one data in the data series 58 is latched, and an alternating signal of a frequency which is represented by the thus latched data and which corresponds to an output logical value is generated from the generating circuit 30. Since data representing a frequency $f_P$ corresponding to output positive logic, a frequency $f_N$ corresponding to output negative logic and a frequency $f_E$ corresponding to abnormal condition are sequentially read out of the data series 58 as shown in FIG. 9, one of such data which is latched by a latch circuit 62 at the timing of occurrence of the decision signal 36 represents a result of the band decision.

The data $f_P$, $f_N$ or $f_E$ latched by the latch circuit 62 is transmitted through the data switching circuit 60 to the alternating signal generating circuit 30 at a time slot within one address period which is allotted for output delivery, so that the circuit 30 generates an alternating signal 32 of a frequency $f_P$, $f_N$ or $f_E$ corresponding to a logical value to be delivered out.

Since, of three frequency signals constituting the alternating signal 32, only the signal generated at the timing is to be delivered out, the timing signal 50 controls a logic circuit 64 such that passage of the other signals through the circuit 64 is prevented and only that signal generated at the timing is permitted to pass to the output terminal 6.

An error detection circuit 66 and a failure detection output circuit 68 also operate at one time slot on a time division basis allotted to these circuits as will be described later.

The operation of the FIG. 8 arrangement will be described specifically in terms of an OR device with reference to FIG. 10.

One period t of the address signal 42 is divided into 6 time slots $t_1$ to $t_6$ to which different functions are allotted. In this example, as shown in FIG. 10, function to decide the frequency band is allotted to the time slots $t_1$ to $t_4$ and function to generate alternating output signals is allotted to the time slot $t_5$. With a view to completing fail-safe capability, function to detect failure is allotted to the last time slot $t_6$.

The data stored in the memory 54 as shown in FIG. 9 is sequentially read out in parallel as the data series 56 and 58 at the time slots $t_1$ to $t_6$ of the address signal 42.

All the procedures to be described below are controlled by the timing signals 46, 48, 49, 50 and 52 produced from the timing circuit 44.

Firstly, at four time slots $t_1$ to $t_4$, alternating signals of four different frequencies $f_{10}$ to $f_7$ are generated from the alternating signal generating circuit 30. To this end, the data series 56 corresponding to the frequencies $f_{10}$ to $f_7$ stored as shown in FIG. 9 in the memory 54 is read therefrom at the time slots $t_1$ to $t_4$ and fed to the alternating signal generating circuit 30 through the data switching circuit 60. The address period t is 96 $\mu$S, for example, and each of the time slots $t_1$ to $t_6$ occurs at the rate of 96 $\mu$S. Consequently, where a pulse is delivered out each time a particular time slot occurs, an alternating signal of 10 KHz ($\approx 1/96$ $\mu$S) can be generated. If it is desired to generate an alternating signal of 5 KHz, the delivery of a pulse will be subject to $\frac{1}{2}$ frequency division in such a manner that a pulse is delivered out at every second occurrence of a particular time slot. By utilizing the frequency division of a particular time slot in this manner, the signal generating circuit 30 can generate alternating signals of frequencies corresponding to the stored data $f_{10}$ to $f_7$ at the timing of each time slot.

As a result, the output 32 of the alternating signal generating circuit 30 has different frequencies in accordance with the time slots $t_1$ to $t_4$, providing $f_{10}=620$ Hz, $f_9=330$ Hz, $f_8=120$ Hz and $f_7=90$ Hz. For example, when paying attention to only the time slot $t_1$, the waveform level changes at the repetition rate of 1/620 Hz.

The frequency comparator 34 receives the output 32 from the alternating signal generating circuit 30 and the summed frequency signal 14 of the alternating signals supplied to the input terminals 4 and 5 so as to compare frequencies of these input signals at the timing of each time slot. It will be appreciated that the frequency of the summed frequency signal 14 is so low that this signal 14 will not alternate within the one address period t.

It is now assumed that the output positive logic corresponds to an input frequency $f_P$ of 300 Hz, the output negative logic corresponds to an input frequency $f_N$ of 50 Hz, and an output frequency $f_E$ of 0 (zero) Hz is produced when a preceding logic device which supplies the input to this OR device is in abnormal operation.

The frequency comparator 34 adopts the ring operation scheme disclosed in the aforementioned Japanese Patents and operates as follows.

As far as the time slot $t_1$ is concerned, time slot components belonging to this time slot $t_1$ occur sequentially at the rate of 96 $\mu$S, and only at the timing of a particular time slot component associated with $f_{10}=620$ Hz, the frequency comparator 30 receives a signal 32 of "1". On the other hand, the other input signal to the frequency comparator 30, that is, the summed frequency signal 14 has a sum of frequencies of the alternating signals applied to the input terminals 4 and 5, measuring $2f_P$, so that only at the timing of a particular component of the time slot $t_1$ associated with $2f_P=600$, the signal 14 assumes "1".

Within the time interval of the particular time slot component, one of the two pulse series 32 and 14 effects up-count and the other down-count to perform a frequency comparison. When the difference between two frequencies reaches a predetermined value at the present frequency comparison, an output signal 36 shown as S36 in FIG. 10 is delivered out at the timing of a subsequent component of the time slot $t_1$. Since, in this example, the signal 32 is 620 Hz and the signal 14 is 600 Hz, the frequency of signal 32 is higher than the frequency of signal 14 and the decision signal 36 does not assume "1" corresponding to the initial component of the time slot $t_1$ until the frequency difference is accumulated to reach the predetermined value.

The operation proceeds at very high speeds as described previously and it takes only several ms for the decision signal 36 to assume "1" corresponding to the initial component.

Similarly, the alternating signals 32 and 14 are also compared at the timing of time slots $t_2$ to $t_4$. In this comparison, the other input i.e., the alternating signal 14 has the same frequency throughout the time slot $t_1$ and the time slots $t_2$ to $t_4$ whereas the frequency of the one input i.e., the alternating signal 32 changes in accordance with the time slots $t_1$ to $t_4$ as shown in FIG. 10. The frequency comparison result at each time slot is recognized as the decision signal 36 for each time slot.

In this manner, the decision signal 36 representative of the frequency comparison result for each time slot can be obtained and its fall i.e., its change from "1" to "0" within one address period is selectively extracted in response to the timing signal 46 to trigger the latch circuit 62. The data in the latch circuit 62 is represented by L62 in FIG. 10. At this time, the decision signal 36 assumes "0" without fail at the time slot $t_2$ or $t_4$ unless the alternating signal applied to the input terminal 4 or 5 contains the frequency $f_E=0$ (zero) Hz. At the preceding time slots, the decision signal assumes "1". More particularly, since, in item Nos. 1 to 3 in Table 2, $2f_P=600$ Hz or $f_P+f_N=350$ Hz is held, the frequency comparison result lies between the reference frequencies $f_{10}=620$ Hz and $f_9=330$ Hz so that the decision signal 36 is "1" at the time slot $t_1$ and "0" at the time slot $t_2$. Further, in item No. 4 in Table 2, $2f_N=100$ Hz is held and hence the frequency comparison result lies between the reference frequencies $f_8=120$ Hz and $f_9=90$ Hz so that the decision signal 36 is "1" until the time slot $t_3$ and will assume "0" at the time slot $t_4$.

Figure 10:
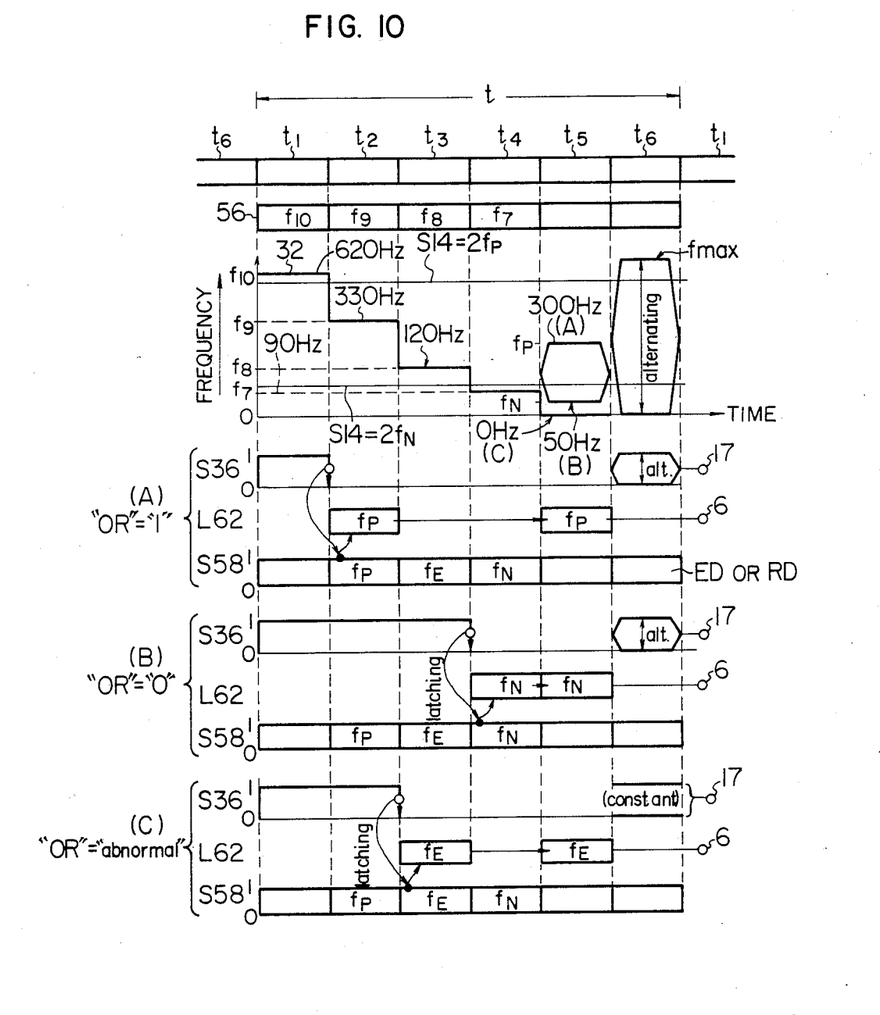
FIG. 10 is a time chart showing the operation of the FIG. 8 device used in terms of an OR device.

Accordingly, the data 58, shown as S58 in FIG. 10, latched at the latch circuit 52 in response to triggering by the fall edge of the decision signal 36 corresponds to the data $f_P$ at the timing of the time slot $t_2$ in connection with item Nos. 1 to 3, and corresponds to the data $f_N$ at the timing of the time slot $t_4$ in connection with item No. 4.

If the decision signal 36 falls at the time slot $t_3$ other than the time slots $t_2$ and $t_4$, it is indicated that abnormal conditions occur in the preceding frequency-band decision and in this case, the data $f_E$ will be latched.

The latched data $f_P$, $f_N$ or $f_E$ of the data series 58 stored in the memory 54 is transferred to the alternating signal generating circuit 30 through the data switching circuit 60 at the timing of time slot $t_5$. As a result, the alternating signal generating circuit 30 generates, in a manner described previously, an alternating signal of the frequency $f_P$ (positive logic), frequency $f_N$ (negative logic) or frequency $f_E$ (abnormal). The logic circuit 64 sends out one of the alternating signals $f_P$, $f_N$ and $f_E$ to the terminal 6 under the control of the timing signal 50 appearing only in the time slot 5.

When the sum of frequencies of the alternating input signals, that is, the frequency of the alternating signal 14 shown in FIGS. 8 and 10 is decided as exceeding the reference frequency $f_{10}$ or erroneously decided as exceeding $f_{10}$, or is decided as being below the reference frequency $f_7$ or erroneously decided as being below $f_7$, the decision signal 36 remains "0" or "1" throughout the time slots $t_1$ to $t_4$, failing to generate triggering by the fall edge. Consequently, none of the data in the data series 58 is latched by the latch circuit 62 and the alternating signal generating circuit 30 will not produce any alternating signal at the time slot $t_5$.

As described above, the OR device based on the frequency logic fulfils itself by receiving at the input terminals 4 and 5 alternating signals of the frequency $f_P$ corresponding to positive logic, frequency $f_N$ corresponding to negative logic or frequency $f_E$ corresponding to abnormal conditions and by delivering the alternating signal corresponding to one of the logics and abnormal condition.

As will be seen from the foregoing operational description, in the logic device, the probability of delivering out the normal output frequencies $f_P$ and $f_N$ can be minimized and fail-safe capability can be improved even when the abnormal frequency other than the normal frequencies is applied to at least one of the input terminals 4 and 5 and even when the arithmetic operation and decision of the frequency values and the generation of the alternating signal become faulty.

Further, by narrowing the frequency-band with respect to which the normal frequency is decided, the probability of detecting the abnormal conditions can be increased, thereby making it possible to further improve the fail-safe capability with ease.

The logic device has been described in terms of the OR device in Table 2 but obviously, it can serve as any one of the other types of logic device in Table 2 by merely rewriting the reference frequency data series 56 and the frequency data series 58 corresponding to the output logical values stored in the memory 54 as shown in FIG. 9.

To use the logic device as an AND device, the positive logic frequency $f_P$ may be delivered only when the frequency-band decision result is $2f_P$ and the negative logic frequency $f_N$ may be delivered when the other combinations of normal alternating input signals are applied to the input terminals, pursuant to Table 2. To this end, of the reference frequency data of the data series 56 stored in the memory 54, $f_{10}=620$ Hz and $f_7=90$ Hz are kept unchanged and $f_9$ and $f_8$ are simply rewritten to 580 Hz and 360 Hz, respectively.

It is also obvious from Table 2 that the OR and AND devices can be converted into NOR and NAND devices, respectively, by exchanging the data $f_P$ and $f_N$ of the data series 58 at the time slots $t_2$ and $t_4$.

While, according to the conventional binary logical scheme, several binary logical devices such as AND, OR or NOT devices must be employed to constitute an EX-OR device, the present invention can provide the EX-OR device with a single logic device.

Figure 11:
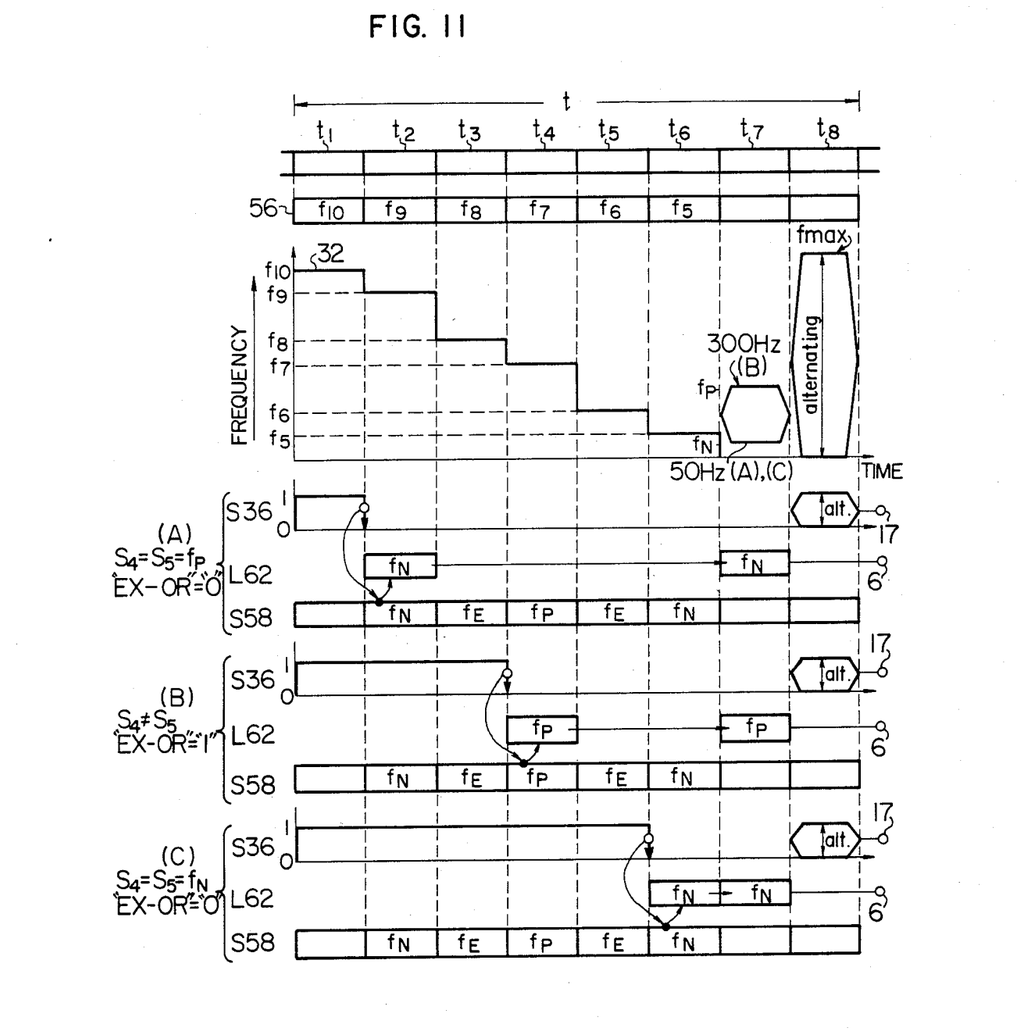
FIG. 11 is a time chart showing the operation of the FIG. 8 device used in terms of an EX-OR device.

More particularly, when considering that the EX-OR device functions to deliver $f_P$ only when the frequency of the signal 14 is $f_P+f_N$ or $f_N+f_P$ and deliver $f_N$ when that frequency is $2f_P$ or $2f_N$, time slots $t_7$ and $t_8$ are added, as shown in FIG. 11, to the time slots shown in FIG. 10, the time slots $t_5$ and $t_6$ are adapted for frequency comparison, and the time slots $f_{10}$, $f_9$, $f_8$, $f_7$, $f_6$ and $f_5$ are respectively set to 620 Hz, 580 Hz, 370 Hz, 340 Hz, 110 Hz and 90 Hz, for example, along with employment of $f_P$ of 300 Hz and $f_N$ of 50 Hz as in the previous embodiment.

FIG. 11 shows in section (A) an operation mode wherein the input frequencies are coincident at $f_P$, in section (B) a mode wherein the input frequencies are different, and in section (C) a mode wherein the input frequencies are coincident at $f_N$.

A two out of three majority circuit can be realized by slightly modifying the FIG. 8 arrangement and the FIG. 9 memory format.

Figure 12:
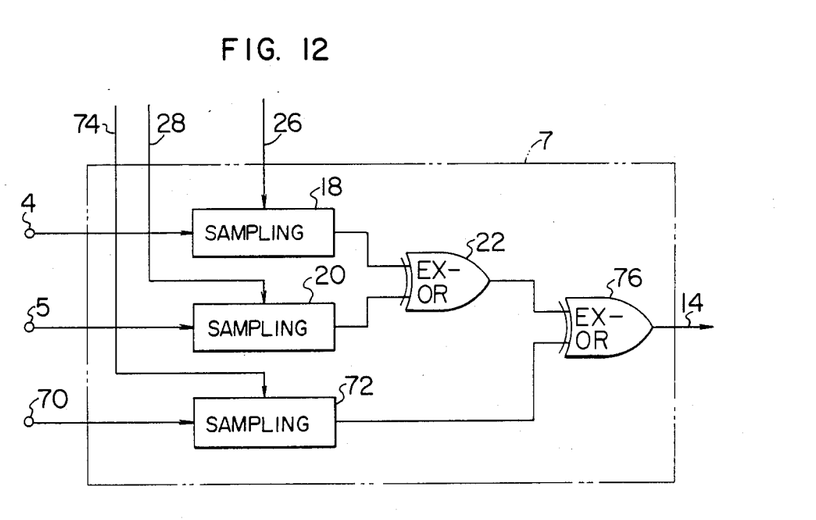
FIG. 12 is a block diagram of an arithmetic operation section substituting for that of FIG. 8 in order for the FIG. 8 device to be used as a majority circuit.

Firstly, the arithmetic operation section 7 of FIG. 8 is replaced by a block as shown in FIG. 12. Thus, an input terminal 70, a sampling circuit 72, a clock signal 74 for the sampling circuit 72 and an EX-OR gate 76 are added so as to obtain an alternating signal having a sum of frequencies of three input signals.

Next, the reference frequency data $f_{10}$ to $f_7$ in the data series 56 stored in the memory as shown in FIG. 9 are rewritten to represent 1000 Hz, 620 Hz, 420 Hz and 120 Hz, respectively.

With this construction, when the sum of the three input frequencies is such that $3f_P=900$ Hz or $2f_P+f_N=650$ Hz, an alternating signal of a frequency $f_P$ representative of output logical value "1" is delivered and when the summed frequency is such that $f_P=2f_N=400$ Hz or $3f_N=150$ Hz, an alternating signal of a frequency $f_N$ representative of output logical value "0" is delivered. When the other frequencies are decided, an alternating signal of a frequency $f_E$ representative of "abnormal" is delivered, which alternating signal turns into a constant signal when the frequency $f_E$ is set to 0 (zero) Hz.

The thus constructed three-input majority circuit fulfils a two out of three logic function.

Turning to the embodiment described with reference to FIGS. 8 to 10, it will be appreciated the function to detect failure is carried out at the timing of the time slot $t_6$ to further improve the fail-safe capability.

To be specific, all the input data to the alternating signal generating circuit 30 is checked by the error detection circuit 66. For example, a rationality check is effected at each time slot through the known method of parity check or cyclic code check, and a resultant signal is used to switch the output frequency of the alternating signal generating circuit 30 occurring at the timing of the time slot $t_6$. When no error occurs within one address period t, an alternating signal of a frequency which is maximized as far as possible is generated. On the other hand, when data containing at least one error occurs, the frequency is switched to 0 (zero) Hz. By making the maximum frequency $f_{max}$ higher than the normal maximum frequency $2f_P$ of the signal 14, the decision signal 36 assumes "1" in the absence of error in the data and assumes "0" in the presence of error. On the other hand, the two data series are stored in the memory 54 as shown in FIG. 9, and the memory 54 receives as one address signal the fedback decision signal 36. Therefore, different data can be read out of the memory 54 dependent on the "1" or "0" value of the decision signal 36. The different data are stored corresponding to different time slot components of the time slot $t_6$ such that the content of the data series 58 is data ED containing an error when the decision signal 36 is "1" and is data RD devoid of error when the decision signal 36 is "0".

With this construction, the decision signal 36 becomes an alternating signal of a frequency higher than a predetermined value at the timing of the time slot $t_6$. Specifically, if the decision signal 36 "1" representative of normal condition is delivered at a particular component of the time slot $t_6$, the data ED containing an error is read out at a subsequent component of the time slot $t_6$ and the error detection circuit 66 and the frequency comparator 34 cooperate to produce a decision signal 36 of value "0". Consequently, at a further subsequent time slot component, the normal data RD is read out and the decision signal 36 again returns to "1". The above operation is repeated and hence the decision signal 36 alternates. For simplicity of explanation, the frequency comparator 34 is described as being able to complete the comparison during each operation slot. Practically, however, the frequency comparison is of the integration type and the frequency comparison is completed through a plurality of components of the time slot $t_6$. Accordingly, the decision signal 36 alternates at a frequency above a predetermined frequency which is lower than the aforementioned operation frequency of 10 KHz.

The alternating signal 36 occurring at the timing of the time slot $t_6$ is sent to the output terminal 17 through the failure detection output circuit 68 by the aid of the timing signal 52 occurring only at the time slot $t_6$.

The alternating signal sent to the output terminal 17 continues to occur so long as the circuits in the logic device operate normally but it stops alternating in the event that either one of the alternating signal generating circuit 30 or the frequency comparator 34 both participating in the normal logic processing as well as the error detection circuit 66 becomes faulty. Accordingly, by monitoring this alternating signal externally, occurrence of any abnormal conditions can be known.

Based on the logic device of the invention as exemplified thus far in terms of the AND, OR, NOT, NAND, NOR or EX-OR device, desired logic designs incorporating the logic scheme according to the invention can be achieved through the same technique as that for the conventional binary logic circuits.

Since various types of flip-flop, register, timer and counter stand for combinations of basic logic devices, they can be constituted like binary logic devices.

The invention has been described by way of the logic device equivalent to the conventional binary logic device but multiple logic circuits of tertiary or more logic stages may be provided readily by selecting the number of logic values as desired.

The internal circuits of the logic circuit are not limited to those used in the foregoing embodiments but they may be implemented by a microprocessor or a desired circuit for discrimination and generation of frequency signals. For example, the frequency-band decision section may precede the arithmetic operation section for frequency signals.

We claim:

1. A logic device responsive to the frequencies of alternating signals which lie in predetermined frequency-bands having a one-to-one relationship to input logical values for performing logical operations, comprising:
   means for inputting at least two input alternating signals;
   arithmetic operation means connected to said inputting means for arithmetically operating on the frequencies of said two input alternating signals to provide a resultant signal having a frequency representing the result of the arithmetic operation;
   decision means connected to the output of said arithmetic operation means for deciding among said predetermined frequency-bands which frequency-band the frequency of said resultant signal lies;

means responsive to the result of said decision by said decision means for delivering an alternating output signal having one of a number of predetermined frequencies which represent output logical values in a one-to-one relationship; and wherein said arithmetic operation means includes means for processing said alternating input signals to provide a resultant signal whose frequency is the arithmetic result of the frequencies of the input alternating signals, and wherein said decision means includes means for comparing said resultant signal of the arithmetic operation with a plurality of reference alternating signals to perform the frequency-band decision.

2. A logic device according to claim 1 wherein the resultant signal is compared with each of said plurality of reference alternating signals at a common frequency comparator shared by said reference alternating signals on a time division basis to perform said frequency-band decision.

3. A majority logic device comprising:
means for inputting to the device at least three alternating signals having frequencies which may be different from each other corresponding to at least two input logical values;
means for effecting a predetermined arithmetic operation for the input frequencies; and
means for delivering out of the device an alternating output signal having a frequency which corresponds to an output logical value depending on whether or not the number of alternating input signals corresponding to the same input logical value as a result of the arithmetic operation exceeds a predetermined value.

4. A logic device comprising:
an alternating signal generating section for generating internal alternating signals at frequencies which correspond to at least two events, respectively;
means for inputting to the device at least one alternating signal having a frequency representative of an input event;
a band decision section receiving said alternating input signal and said two internal alternating signals, for deciding which of said two reference frequencies said alternating input signal coincides with or not; and
means for delivering out of the device an alternating output signal having a frequency which corresponds to a result of the decision.

5. A binary logic device comprising:
(a) means for inputting at least one of two alternating signals each having an alternating frequency assigned to a corresponding logical value, respectively;
(b) means connected to the output of said inputting means for deciding whether the frequency of said at least one input alternating signal lies within either one of two frequency-bands each predetermined in correspondence to two logical values, respectively, or lies outside said two frequency-bands; and
(c) means responsive to the decision made in said deciding means for outputting an output alternating signal having a frequency representing whether said input alternating signal lies in one or the other of said two frequency-bands or outside said two-frequency-bands.

6. A binary logic device according to claim 5, wherein said inputting means inputs one alternating signal, and said outputting means includes means responsive to the result of the decision whether the frequency of said one input alternating signal lies in one of the two frequency-bands which correspond to one of said two logical values for outputting said output alternating signal with a frequency in the frequency-band corresponding to the other of said two logical values, so as to constitute a binary inverter logic device.

7. A binary logic device having input/output alternating signals comprising:
(a) means for inputting at least one of two alternating signals each having an alternating frequency assigned to a corresponding logical value, respectively;
(b) means connected to the output of said inputting means for deciding whether the frequency of said at least one input alternating signal lies within either one of two frequency-bands each predetermined in correspondence to two logical values, respectively, or lies outside said two frequency-bands as a result of an abnormality in said at least one input alternating signal; and
(c) means responsive to the decision regarding the presence or absence of an abnormality as effected in said deciding means for outputting an output alternating signal having either a frequency representing detection of an abnormality or a frequency representing detection of no abnormality.

8. A binary logic device according to claim 7, wherein said inputting means inputs one alternating signal, and said outputting means includes means responsive to the result of the decision whether the frequency of said one input alternating signal lies in one of the two frequency-bands which correspond to either one of said two logical values for outputting said output alternating signal with a frequency in the frequency-band corresponding to the other of said two logical values so as to constitute a binary inverter logic device.

9. A binary logic device comprising:
(a) means for inputting two alternating signals each having any of two different frequencies predetermined in correspondence to two logical values, respectively;
(b) means for executing a predetermined arithmetic operation upon the two frequencies of said two alternating signals to provide a signal having a resultant frequency based on said arithmetic operation;
(c) means connected to the output of said executing means for deciding whether said operated frequency lies within one of two predetermined frequency-bands each corresponding to a logical value or outside said two predetermined frequency-bands as a result of an abnormality;
(d) means for outputting an output alternating signal having one among a plurality of different frequencies in correspondence with the result of the decision by said deciding means.

10. A binary logic device according to claim 9, wherein said plurality of different frequencies outputted by said output means are coincident with said two input predetermined frequencies of said input alternating signals in correspondence with said two input logical values.

11. A binary logic device according to claim 9, wherein said execution means operates to add the two frequencies of said input alternating signals.

12. A logic device according to claim 9, wherein said frequencies corresponding to said input logical values are selected to lie in frequency-bands in which a resultant frequency of said arithmetic operation does not overlap a frequency corresponding to any one of said input logical values.

13. A logic device according to claim 9, wherein said alternating input signals are subjected to a processing corresponding to an arithmetic operation and a resultant signal of the arithmetic operation is compared with a plurality of reference alternating signals to perform said frequency-band decision.

14. A logic device according to claim 13, wherein the resultant signal is compared with each of said plurality of reference alternating signals at a common frequency comparator shared by said reference alternating signals on a time division basis to perform said frequency-band decision.

15. A logic device comprising:
  (a) means for inputting three input alternating signals each having any one among two input frequencies assigned to two input logical values, respectively;
  (b) means for executing a predetermined arithmetic operation upon the frequencies of said three input alternating signals;
  (c) means responsive to the frequencies outputted from said arithmetic operation executing means for deciding whether the number of input alternating signals have frequencies corresponding to one input logical value; and
  (d) means for providing an output alternating signal having a frequency predetermined in correspondence to the result of the decision by said deciding means.

16. A binary logic device comprising:
  (a) means for inputting two input alternating signals each having any one between two frequencies assigned to two input logical values, respectively;
  (b) means for executing a predetermined arithmetic operation on the frequencies of said two input alternating signals;
  (c) means for generating a plurality of reference alternating signals having frequencies different from each other;
  (d) means for comparing a resultant frequency outputted from said executing means with each of said plurality of reference alternating signals to find a frequency-band including said resultant frequency; and
  (e) means responsive to the output of said comparing means for outputting an output alternating signal having a frequency corresponding to an output logical value allotted to the found frequency-band.

17. A logic device according to claim 16, wherein the resultant signal is compared with each of said plurality of reference alternating signals at a common frequency comparator shared by said reference alternating signals on a time division basis to perform said frequency-band decision.

* * * * *